US006802722B2

(12) United States Patent
Tafoya et al.

(10) Patent No.: US 6,802,722 B2
(45) Date of Patent: Oct. 12, 2004

(54) RETAINER BRACKET FOR CONNECTORS

(75) Inventors: Anthony S. Tafoya, Albuquerque, NM (US); Edward Montoya, Moriarty, NM (US); Richard J. O'Brien, Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/349,284

(22) Filed: Jan. 21, 2003

(65) Prior Publication Data

US 2003/0203672 A1 Oct. 30, 2003

Related U.S. Application Data

(60) Provisional application No. 60/375,066, filed on Apr. 24, 2002.

(51) Int. Cl.$^{7}$ .................................................. H05K 1/00

(52) U.S. Cl. .......................... 439/79; 439/378; 439/953

(58) Field of Search ............................. 439/79, 80, 63, 439/953, 378, 357, 358

(56) References Cited

U.S. PATENT DOCUMENTS

| | | | | |
|---|---|---|---|---|
| 4,428,636 A | * | 1/1984 | Kam et al. | 439/404 |
| 5,125,849 A | | 6/1992 | Briggs et al. | |
| 5,234,353 A | * | 8/1993 | Scholz et al. | 439/289 |
| 5,538,437 A | * | 7/1996 | BatesI et al. | 439/352 |
| 6,074,236 A | | 6/2000 | Wu | |
| 6,315,606 B1 | | 11/2001 | Hwang | |
| 6,347,955 B1 | | 2/2002 | Huang | |

OTHER PUBLICATIONS

PCT International Search Report —PCT/US 03/12559, Aug. 5, 2003.

* cited by examiner

*Primary Examiner*—Neil Abrams
*Assistant Examiner*—Phuong Dinh
(74) *Attorney, Agent, or Firm*—Kurt A. Luther; Dennis Armijo

(57) ABSTRACT

A method and apparatus for retaining and aligning a connector to a mating connector on a printed wiring board with a retainer bracket. The retaining bracket is especially useful when there is a bend in the cable. Female contacts in a coax cable assembly mounted to a P0 connector make it difficult to keep the P0 female contacts in a vertical position satisfactory for mating with male contacts located on a motherboard. The retainer bracket snaps directly onto the P0 shell eliminating any stack up problems and assisting with alignment of the P0 female contacts giving a more accurate vertical registration for mating. The connector bracket snaps onto the P0 shell with snap pins and is aligned with at least one alignment pin.

10 Claims, 4 Drawing Sheets

RETAINER BRACKET FOR CONNECTORS

CROSS-REFERENCE TO RELATED APPLICATIONS

This application is based on U.S. Provisional Application Ser. No. 60/375,066, entitled "Bracket, Retainer Connector", filed on Apr. 24, 2002, the teachings of which are incorporated herein by reference.

GOVERNMENT RIGHTS

The U.S. Government has a paid-up license in this invention and the right in limited circumstances to require the patent owner to license others on reasonable terms as provided for by the terms of N00019-00-C-037 awarded by the Department of the Navy.

BACKGROUND OF THE INVENTION

1. Field of the Invention (Technical Field)

The present invention relates to electrical connector brackets and more particularly to a method and apparatus for initially aligning and maintaining alignment of contact points in a connector assembly.

2. Background Art

With respect to the F18 advance mission controller (AMC) program, there is a versa module European (VMB) module, image processor module_advanced multipurpose display (IPM_AMPD), installed in the processor chassis. FIG. 1 shows an exploded view of a module using a prior art connection scheme, which consists of an image processor circuit card assembly (IPM CCA) 100, advanced multipurpose display card assembly (AMPD CCA) 101, frame/heatsink 102, P1 connector 103, P2 connector 104, and P0 connector assembly 105. P1 connector 103 is located in the lower right corner and P2 connector 104 is located in the lower left corner of a Versa Module Europe (VME) base board printed wiring board (PWB) on the component side view as shown in FIG. 1. P0 connector assembly 105 is located in the center of the PWB and mounts between the P1 103 and P2 104 connectors. In this particular embodiment, both P1 connector 103 and P2 connector 104 are IEC 603-2 connectors. P0 connector assembly 105 is Euro card Center DIN 41612 Plug Connector. These are International Electrotechnical Commission (IEC) and Deutsches Insitut fur Normung (DIN) standards, that are well known in the art. Interface between module and motherboard occurs through the P0 105, P1 103 and P2 104 connectors.

Mounted on the AMPD mezzanine card 101 are two 75 Ω coax cable assemblies 110. The right angle printed circuit board (PCB) terminations 106 are mounted to mezzanine card 101. The 75 Ω female contacts 114 are mounted to P0 connector 105. The vertical positioning of the 75 Ω female contact 114 must be maintained for adequate contact registration with the 75 Ω male contacts of the motherboard. The mounting of the cable assemblies to the mezzanine PWB 101 and P0 connector 105 creates a ninety degree (90°) angle 118 making it difficult to control this position. Cable ties 119 are normally used to keep the cables in place and maintain the proper angle.

The problem occurs during the assembly of the IPM_AMPD VME module. The ninety-degree (90°) angles 118 are created during assembly make it impossible to control vertical positioning. Damage to both female 114 and male contacts occur during engagement if adequate vertical positioning is not maintained.

The present method for positioning a connector is to visually line up the female connector end to the male connector end and hope the alignment is correct. The present invention is a tool for providing adequate alignment, maintaining the alignment and also for providing support for necessary bends in the cable.

SUMMARY OF THE INVENTION DISCLOSURE OF THE INVENTION

The present invention discloses a solution to applications with alignment and tolerance stack-up issues with connectors. The preferred bracket for holding and aligning at least one connector to an adjoining at least one mating connector comprises structure for affixing the bracket to an adjoining at least one mating connector and a connector holder affixed to the bracket for holding the at least one connector in alignment to the adjoining at least one mating connector. The preferred structure for affixing comprises at least one snapping pin and at least one alignment pin, the at least one snapping pin and the at least one alignment pin corresponding to unused apertures in the at least one mating connector. The preferred at least one snapping pin comprises a pin substantially the same configuration as the unused aperture and further comprising a slot and a ridge. The preferred at least one alignment pin comprises a configuration substantially similar to the unused aperture. The preferred at least one snapping pin and at least one alignment pin comprise tapered edges. The preferred bracket comprises a non-conducting material. The at least one adjoining connector can comprise a P0 connector shell. The at least one connector and the at least one mating connector can comprise at least one coax cable connector pair. The at least one connector and the at least one mating connector can also comprise at least one ribbon cable connector pair. The bracket can further comprise at least one stepped edge disposed on the bracket for aligning the bracket to the at least one adjoining connector.

The preferred method of aligning a connector with a mating connector comprises the steps of providing a bracket, affixing the connector to the bracket and snapping bracket pins into at least one unused aperture in a mating connector and simultaneously mating the connector to the mating connector. The step of affixing preferably comprises affixing the connector to a connector holder. The step of snapping preferably comprises snapping at least one snapping pin and at least one alignment pin.

A primary object of the present invention is to eliminate stack up issues.

Another object of the present invention is to ensure adequate registration between female and male contacts.

Yet another object of the present invention is to relieve stresses on solder joints.

A primary advantage of the present invention is that it mounts directly to the P0 connector eliminating the tolerance stack-up encountered in the prior art methods of connector alignment.

Another advantage of the present invention is that contact orientation is maintained even after disengaging the connection, thus eliminating the need to realign the contacts when making a new connection.

Yet another advantage of the present invention is that the solder joints from the coax cable to the mezzanine board are undisturbed during engagement or disengagement of the P0 connector to the motherboard.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS BEST MODES FOR CARRYING OUT THE INVENTION

The present invention provides a solution to the alignment of male to female connectors for mating the connectors and also provides for a means of maintaining the alignment of the connectors, especially where a bend is required in the cable. The purpose of the invention is to ensure a more accurate registration of a coax cable contacts to the mating contacts of the motherboard. The assembled retainer is used to ensure a more accurate registration. The snaps secure the retainer to the P0 connector while the alignment pin secures adequate location with respect to P0 connector.

Figure 1:
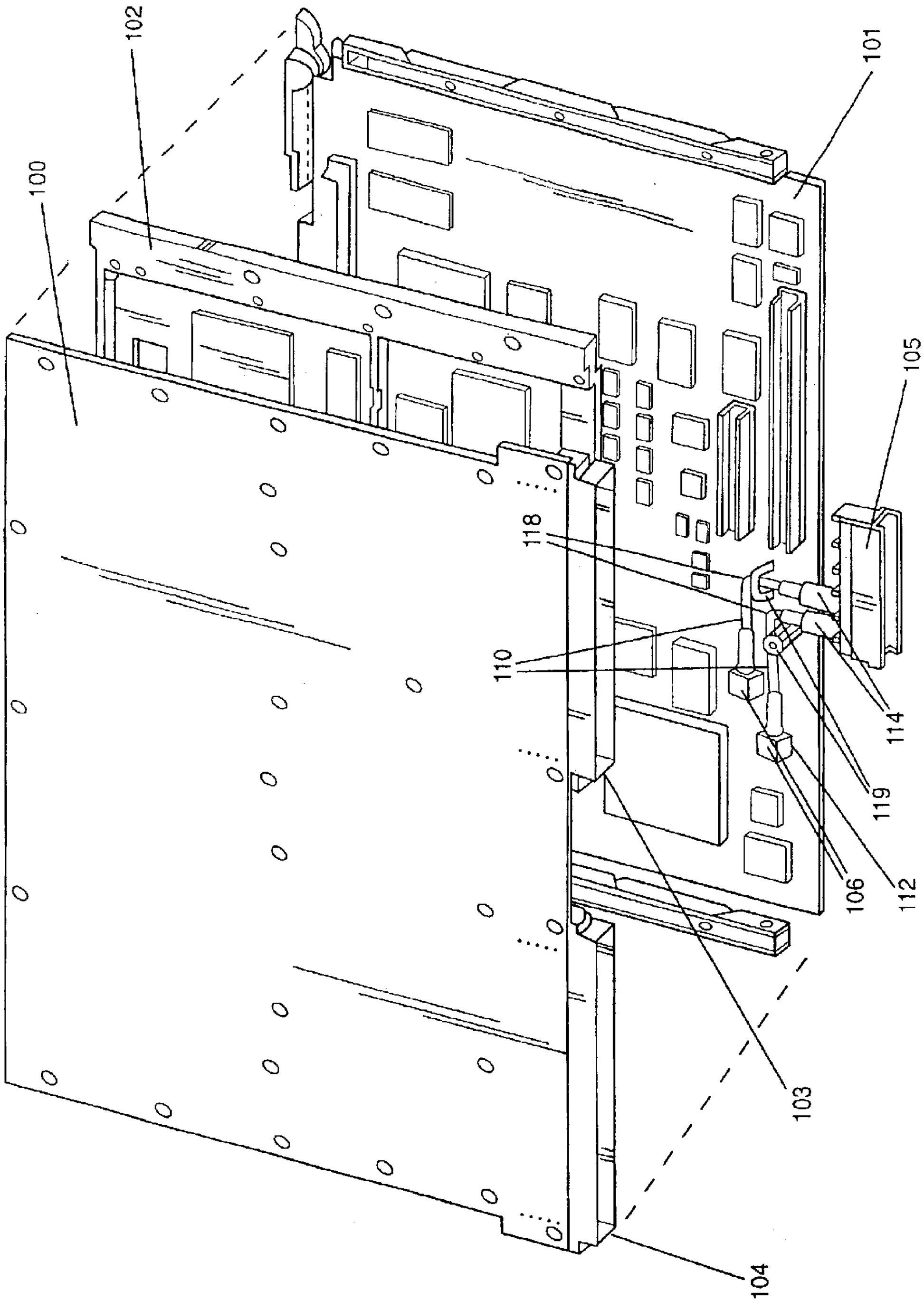
FIG-1 Prior Art
FIG. 1 is an exploded view of a VME module showing the prior art method of cable alignment.
Figure 2:
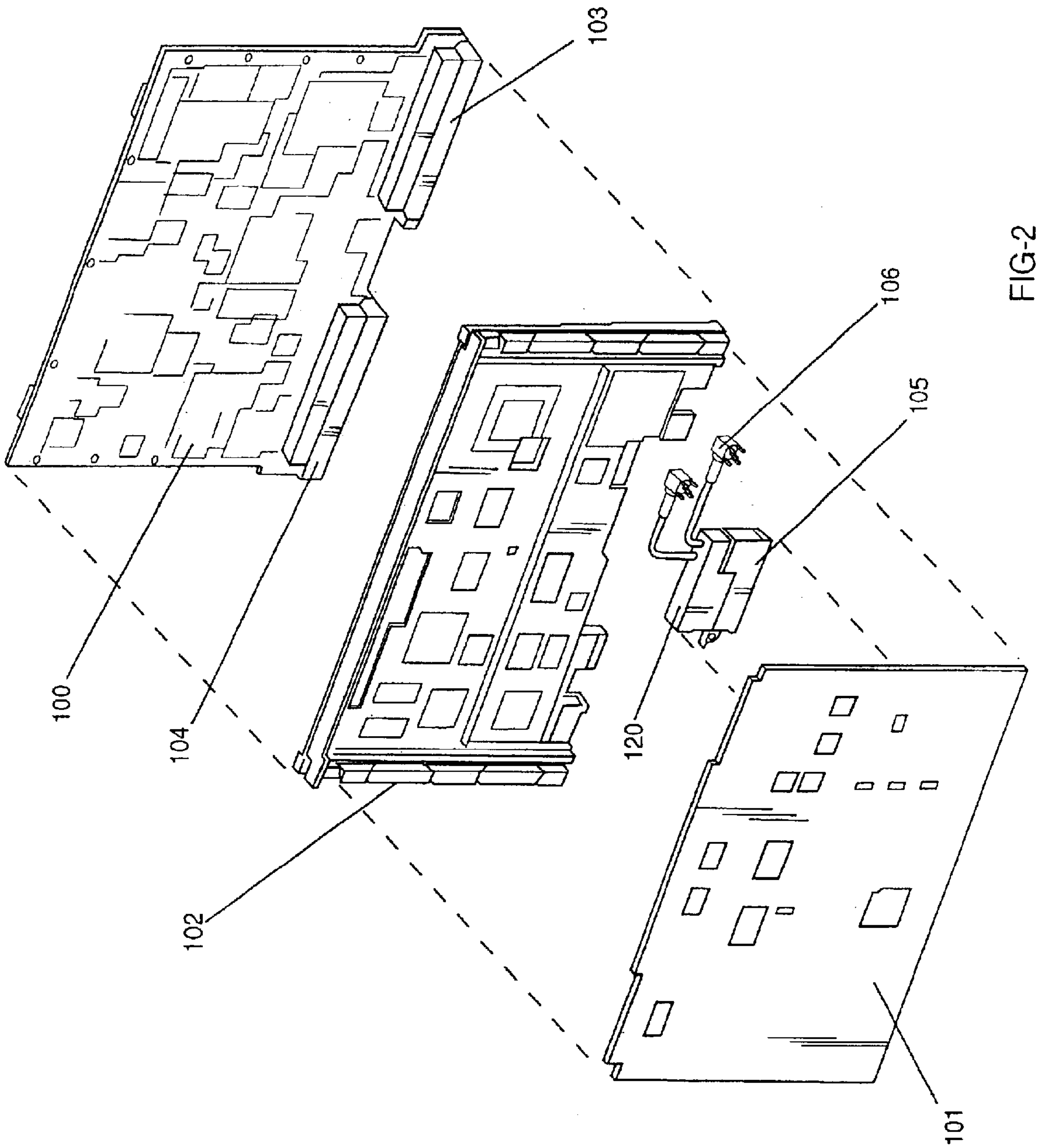
FIG. 2 is a perspective view showing the P0 connector assembly with the new retainer bracket.
Figure 3:
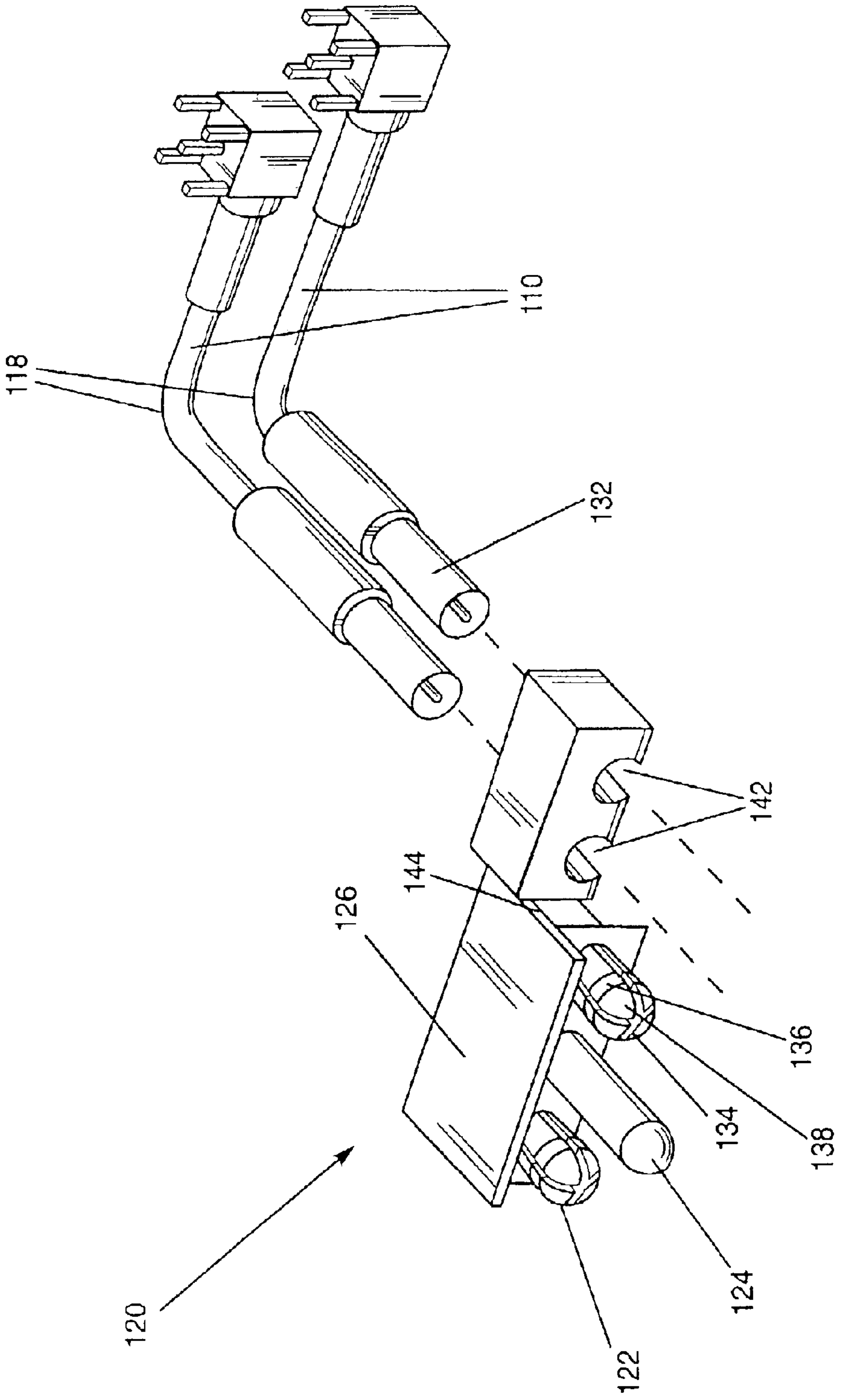
FIG. 3 is a perspective view of the preferred retainer bracket.

FIG. 2 show the retainer bracket 120 attached to the P0 connector 105 and FIG. 3 shows a perspective view of the retainer bracket. Retainer bracket 120 preferably consists of two snaps 122 and an alignment pin 124. The number of snaps 122 and alignment pins 124 can be varied depending the structural forces placed on the connectors, the number of unused apertures in the P0 connector and a users preference. Snaps 122 and alignment pin 124 are manufactured to fit into unused apertures in the P0 connector 105. Snaps 122 and alignment pin 124 are preferably pressed into the retainer body 126 or affixed to retainer body 126 in methods well known in the art. Snaps 122, as shown, consist of a slot 134 with a ridge 136 and a tapered end 138, which in combination snap into the aperture of the P0 connector and also hold the retainer body 126 in place. The preferred alignment pin 124 consists of a body configured to be substantially the same width and shape of the unused aperture of the P0 connector 126. In the embodiment as shown the pin 124 is shaped like a tapered dowel, however the pin 124 can comprise any other configuration that maintains an alignment with the P0 connector body. The size, shape and tolerance for the snaps 122 and pins 124 are necessary to maintain the alignment and stability of the retainer body 126 to the P0 connector 105. In the alternative, snapping clamps can be used to secure the retainer bracket to the P0 connector (not shown). Other means of attachment can also be used, as long as the means remains secured to the P0 connector and keeps the connectors mating contacts in alignment. The material of the entire assemble is preferably manufactured from a laminated cellulose fabric base material such as phenolic, or a similar nonconductive material with similar properties.

Also affixed to retainer body 126 are one or more connector holders 142. Each connector holder 142 is configured to hold a coax cable end 132 in place on the retainer bracket 120. Although, only coax connector ends are shown, the connector holder can be configured to hold other types of cable ends that are well known in the art. In the embodiment as shown, coax cable end 132 snaps into a connector holder 142, thus keeping coax cable end 132 affixed in connector holder 142. To assist in aligning the retainer bracket 120 to the P0 connector 105 one or more stepped edges 144 can be disposed on the retainer body 126, as shown.

Retainer bracket 120 was designed to mate directly to the P0 connector 105 to eliminate stack-up issues and ensure reliable registration with mating connector and associated contacts. To assemble, insert the coax cable ends 132 into the applicable connector holders 142. Align the coax cables ends 132 with applicable retainer slots and snap retainer bracket 120 onto P0 shell 105. Ensure that the snaps 122 and alignment pin 124 are inserted into the appropriate slots of the P0 shell 105. By using the present invention, the cable can be manipulated at any angle and the alignment of the connectors is maintained and the connection can be made with a minimum effort.

Figure 4:
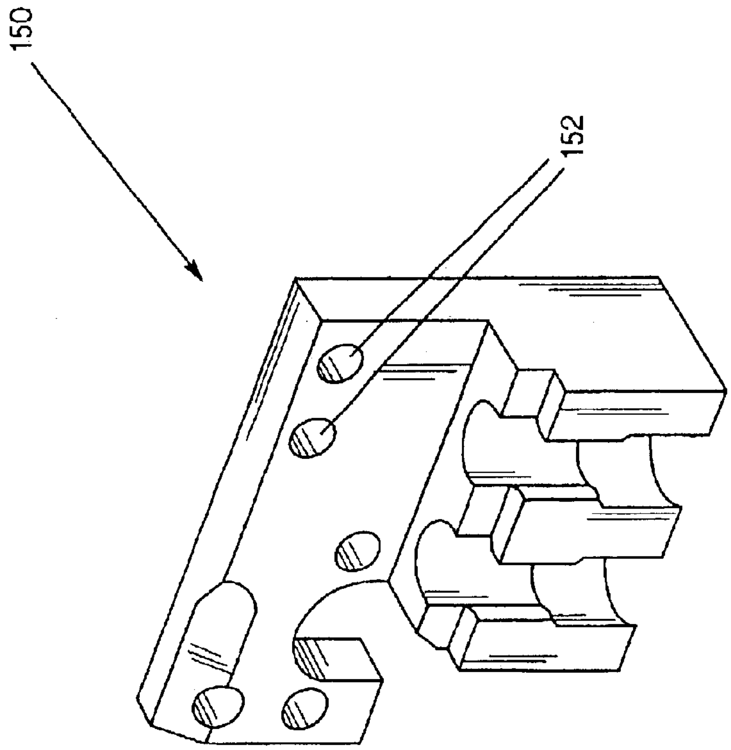
FIG. 4 shows another design of an alternative retainer bracket.

Initially, in the earlier stages of solving the alignment problem, another concept was developed. The alternative bracket 150 mounted directly to the AMPD PWB 101 via screw holes 152 and the P0 connector 105 mounted directly between the P1 103 and P2 104 connectors on the IPM CCA 100. The alternative bracket 150 is shown on FIG. 4. However, this configuration created unacceptable tolerance stack-up issues, which can prevent adequate registration. By locating the new retainer directly on the P0 connector, much of the stack-up issues are eliminated.

The preferable way of production is dependent on quantities. If quantities range in the hundreds of thousands, injection mold process will be the preferable way of production. The major cost for this method is the nonrecurring engineering (NRE) for the mold. Depending on the number of cavities per mold, these parts could be produced at a very low cost. For mass production of the retainer, injection molding using a glass filled plastic with desirable electrical and mechanical characteristics would be the preferable choice. The snap locations could be arranged to accommodate different configurations. If it is desirable to use all holes for cable mount, one can consider bonding the retainer to P0 shell or designing a part (injection molding) that reflects the retainer/P0 shell as on piece.

The critical tolerances would be the snaps with respect to the P0 mount holes as well as the tolerances for the cable guides. Material used to manufacture the invention would be required to withstand some temperature extremes as well as vibration and shock tests.

Desirable material for the retainer bracket must have a balance between ductile and brittle (i.e., ductile enough for snap deflection but brittle enough so the elastic limit of the material is not exceeded.) This material should also withstand the given environmental conditions. A glass filled plastic would be a preferable candidate if injection molding is the chosen process. For a low volume requirement a machining process can be used with phenolic or laminated sheet, cellulose fabric base material.

These type of connectors (P0) are used in many applications such as any industry that uses VME technology in electronic equipment, or other applications with similar alignment and tolerance stack-up issues. This invention is not limited to coax type connections, but can be used for alignment of other types of cable/connector assemblies, such as ribbon cables or other types of multi-pin connections.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. A bracket for holding and aligning at least one connector to an adjoining at lease one mating connector, the bracket comprising:

a means for affixing said bracket to an adjoining at least one mating connector, wherein the means for affixing comprises at least one snapping pin and at least one alignment pin, wherein said at least one snapping pin and said at least one alignment pin can be varied and correspond to unused apertures in the at least one mating connector; and a connector holder affixed to said bracket for holding the at least one connector in alignment to the adjoining at least one mating connector.

2. The invention of claim 1 wherein said at least one snapping pin comprises a pin substantially the same configuration as a first unused aperture from the unused apertures and further comprising a slot and a ridge.

3. The invention of claim 1 wherein said at least one alignment pin comprises a configuration substantially similar to a second unused aperture from the unused apertures.

4. The invention of claim 1 wherein said at least one snapping pin and said at least one alignment pin comprise tapered edges.

5. The invention of claim 1 wherein said bracket comprises a non-conducting material.

6. The invention of claims 1 wherein said at least one adjoining connector comprises a P0 connector shell.

7. The invention of claim 1 wherein the at least one connector and the at least one mating connector comprise at least one coax cable connector pair.

8. A method of aligning a connector with a mating connector, the method comprising the steps of:

providing a bracket, wherein the bracket comprises at least one snapping pin and at least one alignment pin, wherein the at least one snapping pin and the at least one alignment pin can be varied and correspond to unused apertures in the mating connector;

affixing the connector to the bracket; and snapping the at least one snapping pin into a first unused aperture in the mating connector and simultaneously mating the connector to the mating connector.

9. The method of claim 8 wherein the step of affixing comprises affixing the connector to a connector holder.

10. The method of claim 8 wherein the step of snapping further comprises snapping the at least one alignment pin.

* * * * *